(12) United States Patent
Denis et al.

(10) Patent No.: US 10,014,833 B2
(45) Date of Patent: Jul. 3, 2018

(54) SPLITTER/COMBINER SYSTEM FOR RF WAVES

(71) Applicant: THALES, Courbevoie (FR)

(72) Inventors: Stéphane Denis, La Bouexiere (FR); Christophe Champagne, Domagne (FR); Solenne Hameau, Chateaubourg (FR)

(73) Assignee: THALES, Courbevoie (FR)

( * ) Notice: Subject to any disclaimer, the term of this patent is extended or adjusted under 35 U.S.C. 154(b) by 14 days.

(21) Appl. No.: 15/242,026

(22) Filed: Aug. 19, 2016

(65) Prior Publication Data

US 2017/0170793 A1    Jun. 15, 2017

(30) Foreign Application Priority Data

Aug. 21, 2015   (FR) ..................................... 15 01760

(51) Int. Cl.
| | |
|---|---|
| *H01P 5/12* | (2006.01) |
| *H03F 3/21* | (2006.01) |
| *H03F 3/189* | (2006.01) |
| *H03F 1/56* | (2006.01) |
| *H03H 11/30* | (2006.01) |

(52) U.S. Cl.
CPC ............... *H03F 3/211* (2013.01); *H03F 1/56* (2013.01); *H03F 3/189* (2013.01); *H03H 11/30* (2013.01); *H03F 2200/451* (2013.01); *H03F 2203/21106* (2013.01); *H03F 2203/21142* (2013.01)

(58) Field of Classification Search
CPC . H03F 3/211; H03F 1/56; H03F 3/189; H03F 2200/451; H03F 2203/21106; H03F 2203/21142; H03H 11/30; H01P 5/12
See application file for complete search history.

(56) References Cited

U.S. PATENT DOCUMENTS

| | | |
|---|---|---|
| 4,680,557 A | 7/1987 | Compton |
| 5,142,253 A | 8/1992 | Mallavarpu et al. |
| 5,256,988 A | 10/1993 | Izadian |
| 2014/0016788 A1 | 1/2014 | Rass |

FOREIGN PATENT DOCUMENTS

CN      102 280 681 A      12/2011

*Primary Examiner* — Robert J Pascal
*Assistant Examiner* — Kimberly Glenn
(74) *Attorney, Agent, or Firm* — Baker & Hostetler LLP

(57) ABSTRACT

A splitter/combiner system for RF signals comprises: a coaxial line comprising an inner block extending longitudinally along an axis Y, having a conductive surface and being inserted into an outer block whose inner cavities have conductive walls, the inner block separated from the outer block by an insulating space, the coaxial line having a connection end; a plurality of N strip lines, each comprising a first and second conductive strip positioned facing either side of an insulating or dielectric substrate; one of the ends of each strip line, referred to as the first end, being positioned tangentially on the perimeter of the inner block in the space at the connection end of the coaxial line, the first and second conductive strips of the first end of the strip line making electrical contact with the inner block and the outer block, respectively, the outer block additionally connected to the system ground.

15 Claims, 9 Drawing Sheets

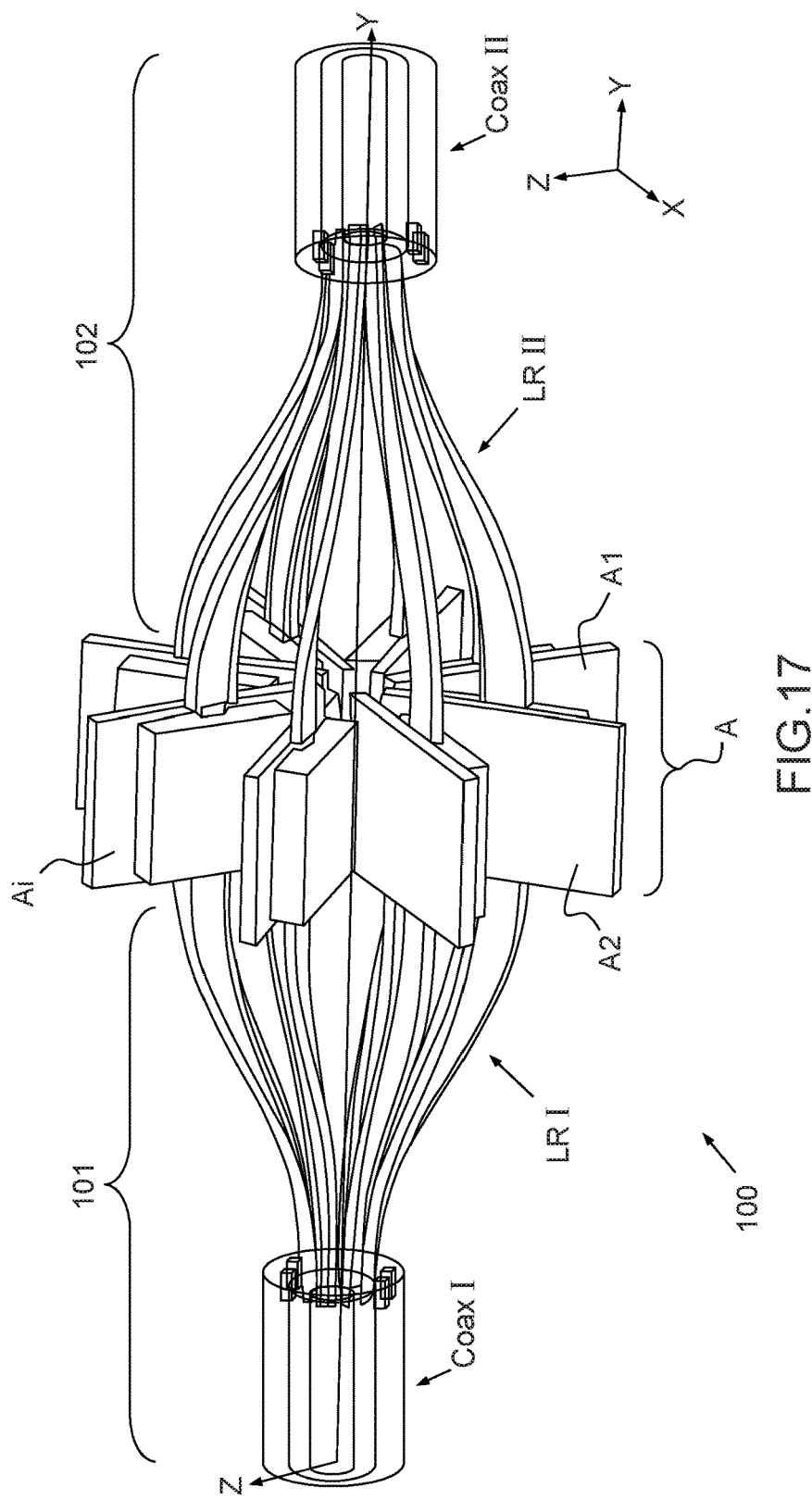

SPLITTER/COMBINER SYSTEM FOR RF WAVES

CROSS-REFERENCE TO RELATED APPLICATION

This application claims priority to foreign French patent application No. FR 1501760, filed on Aug. 21, 2015, the disclosure of which is incorporated by reference in its entirety.

FIELD OF THE INVENTION

The invention relates to the field of passive components for RF waves, and more particularly components for splitting or combining beams. These components allow a signal to be subdivided into multiple paths or signals arising from various paths to be recombined into a single path.

The invention also relates to a radiofrequency and microwave power amplifier produced from splitter/combiner components, the amplifier being subdivided into multiple elementary amplifiers in parallel. The invention may be used in any systems employing amplifiers of travelling wave tube, or TWT, type, such as radar onboard drilling systems and missiles, or systems onboard drones or satellites. Travelling wave tube amplifiers may advantageously be replaced by amplifiers based on splitters/combiners according to the invention.

BACKGROUND

The highest RF powers are reserved for travelling wave tube (TWT) amplifiers and other magnetrons and klystrons. These allow power levels to be reached that are inaccessible with simple solid-state amplifiers, composed of transistors.

For medium power levels, there are also compact TWTs whose bulk is similar to that of basic transistor-based amplifiers.

However, with the progress made in the past few years in the field of transistors based on semiconductors of GaN and/or SiC type, these components allow solid-state amplifiers to be produced that gain ground on the power ranges covered by TWTs, with multiple extra advantages:
higher reliability and longer life;
a broader passband;
a reduced noise factor;
increased linearity;
a more conventional supply voltage.

Solid-state amplifiers are produced in monolithic form or else in the form of hybrid components, up to a certain power level which currently extends up to a few hundred watts in the X-band. Beyond that, multiple elementary amplifiers (monolithic or hybrid) must be used in parallel to generate even higher powers and thus exceed the kW level.

For this, the signal is subdivided into multiple paths going to the various elementary amplifiers. The amplified signals are subsequently recombined into a single path.

Most often, the same type of device may be used as a power combiner or splitter. One role is switched to the other by swapping the sources and loads.

In order for the assembly to be energy efficient, insertion losses from these splitter-combiners should be optimized. From this perspective, structures based on waveguides are the most effective. They exhibit very low insertion losses and withstand very high powers, in particular in the form of rectangular waveguides.

However, these structures and, in particular, those using rectangular waveguides are very bulky and have limitations in terms of frequency bands which are linked to limited space and to the multiple modes that are propagated. For example, these structures are not suitable for a frequency band covering at least the X-band and for a space with a diameter of less than 50 mm.

Document U.S. Pat. No. 5,142,253 describes a solution with spatial power combining based on an oversized coaxial waveguide.

The term "oversized" means, in this instance, that the diameters of the coaxial structure are greater than the maximum dimensions required for the guide to operate in the single fundamental mode or for the cavities to be free of resonances in the useful band. By way of indication, a cylindrical guide has a first propagation mode (TE11) located above 10 GHz when its diameter exceeds 8.8 mm, and a coaxial line with a characteristic impedance of 50 ohms has multiple propagation modes (including TE11) above 10 GHz when its large diameter exceeds 13.3 mm. In summary and to give a rough indication, above 10 GHz a roughly cylindrical structure whose internal diameter exceeds 9 mm may pose problems of multiple propagation modes or parasitic resonances.

In order to keep production simple, this structure leads to oversized diameters over more than $2/3$ of its length for frequencies above 10 GHz.

This solution requires substantial volumes to be occupied by RF absorbents, which necessarily increase losses. It is not possible to remove these absorbents without the possible occurrence of parasitic resonances that will decrease the performance of the structure.

This structure requires the assembly of numerous mechanical parts, thereby leading to an assembly lacking robustness.

This solution does not allow the simple interconnection of multiple elementary amplifiers, in particular with microstrip accesses (the most common configuration) distributed radially (the most practical arrangement for a cylindrical format). Moreover, they are highly mechanically complex to produce, in particular when compactness and coverage of high useful frequencies is sought.

Additionally, the specified performance, with insertion losses of 0.5 dB over a frequency band from 2.5 to 10 GHz, is not sufficient for the target applications.

Another, more recent, type of solution, also based on spatial power combining around a coaxial waveguide and better suited to radially arranged microstrip accesses has been proposed, for example, in document US2014/016788.

This solution makes it possible to split or recombine the power to/from multiple paths or elementary amplifiers, in a reduced space and over a broad frequency band.

However, the results of this solution show that the dimensions are too great and insertion losses are too high.

In this structure, the elementary amplifiers are arranged radially in the space between the two conductors that form a coaxial guide. This guide is substantially oversized so as to be able to house these amplifiers and the various parallel paths that carry out the required impedance transformations towards the microstrip ends.

The impedance transformations are carried out using antipodal lines, such as described in FIG. 5 of the document, that are adapted to coaxial lines. These structures have two metal tracks positioned on opposite faces of a substrate; these tracks have a structure that resembles a slot line, of high characteristic impedance, at one end and a microstrip line, of lower characteristic impedance, at the other end. One track progressively widens so as to produce the ground plane and the other track widens and then narrows to ultimately form the line of the microstrip structure.

The oversizing of the coaxial guide increases as the number of elementary amplifiers (or paths, in this instance the antipodal lines) increases: More space is necessarily required in order to house more amplifiers, but this is not the only reason, as when the number of amplifiers is increased, then, at constant impedance (maximum value) on the input of each path, the characteristic impedance of the coaxial guide is necessarily lower, thereby also leading to the guide being oversized in order to retain the same coaxial space. Specifically, it is necessary to increase the diameters of the coaxial line in order to obtain a lower characteristic impedance for one and the same space between the core (centre) and the body (perimeter) of the coaxial guide. As a result of the growing occurrence of propagation modes of higher orders and possible associated resonances, performance will decrease and bulk will increase as a function of the number of elementary amplifiers and the highest useful frequency.

Furthermore, as the diameters of the coaxial guide increase, paths or amplifiers must increasingly be used in order to minimize discontinuities. Stated otherwise, using a coaxial guide of smaller diameter allows broader bands of frequencies to be covered, with higher useful frequencies, or else requires a smaller number of elementary amplifiers. For example, by taking this line of reasoning to the extreme, a coaxial of sufficiently small size could even get by with a single amplifier, constituting a very dissymmetrical case that is favourable for the excitation of higher modes or resonances and which it is desirable to avoid in an oversized waveguide.

From this perspective, the structure described in document US2014/016788 requires a large number of amplifiers in order to provide a broad passband and raised high useful frequency.

The aforementioned drawbacks indicate that the performance and bulk of this structure are limited by these two antagonistic elements: on the one hand the number of amplifiers must be limited in order to limit bulk and provide sufficient performance at high frequency (insertion losses, efficiency, gain ripple), and on the other hand a minimum number of amplifiers is needed in order to provide sufficient RF performance (maximum power, passband).

Stated otherwise, the antagonism over the larger or smaller number of paths or amplifiers is due to the need to minimize their number so that the structure is compact and little affected by higher modes and other parasitic resonances (maximum useful frequency, insertion losses, ripples) and the need for enough amplifiers so that the transition between the antipodal and coaxial portion is efficient (maximum useful frequency, insertion losses, ripple, but also maximum power).

Additionally, the complexity of producing this structure is also substantial, and it becomes increasingly complex as more elementary amplifiers are added. Moreover, this structure requires the assembly of numerous mechanical parts, thereby leading to an assembly lacking robustness.

An aim of the present invention is to overcome the aforementioned drawbacks by proposing a single-mode splitter/combiner system that has a broad passband in the vicinity of a useful frequency, is compact and is produced from a reduced number of mechanical parts, thereby allowing the assembly to have increased robustness and mechanical strength.

SUMMARY OF THE INVENTION

One subject of the present invention is a splitter/combiner system for RF signals comprising:

a coaxial line comprising an inner block extending longitudinally along an axis Y, having a conductive surface and being inserted into an outer block whose inner cavities have conductive walls, the inner block being separated from the outer block by an insulating space, said coaxial line having a connection end;

a plurality of N strip lines, each strip line comprising a first and a second conductive strip that are positioned facing either side of an insulating or dielectric substrate;

one of the ends of each strip line, referred to as the first end, being positioned tangentially on the perimeter of the inner block in said space at the connection end of the coaxial line, the first and the second conductive strips of the first end of the strip line making electrical contact with the inner block and the outer block, respectively, the outer block additionally being connected to the system ground.

Advantageously, the impedance of each first end of the strip lines is matched to the impedance of the coaxial line at the connection end.

Advantageously, an impedance at the first end of each strip line is substantially equal to N times the impedance of the coaxial line at its connection end, so as to contribute to matching the impedance of each first end of the strip lines to the impedance of the coaxial line at its connection end.

According to a first variant, the inner block and the outer block have, at the connection end, voids that are located between adjacent strip lines, so as to contribute to said impedance matching.

According to another variant, for each strip line, the width over which the two conductive strips are facing one another, along with their respective thicknesses, are determined so as to contribute to said impedance matching.

According to another variant, for an X-band RF signal, the width of the conductive strips is smaller than or equal to 1 mm and the thicknesses are greater than or equal to 80 μm.

According to another variant, the facing conductive strips are laterally offset with respect to one another at the first end so as to contribute to said impedance matching.

Advantageously, the form of the inner block of the coaxial line is conical.

Advantageously, the coaxial line is configured so as to be single mode in a frequency band used by the system.

According to one embodiment, the system is produced in a block comprising the outer block and whose inner cavities have conductive walls, the system additionally comprising:

a cavity adjoining the connection end of the coaxial line, the strip lines being fixed to the block, and a plurality of N tunnels hollowed out of the block, each tunnel comprising an associated strip line.

Advantageously, the cavity is dimensioned so as not to propagate parasitic modes and/or not to generate resonances in a band of frequencies used by the system.

Preferably, the tunnels are configured so that a second end of each strip line is positioned in a circle having a diameter that is greater than the diameter of the coaxial line.

Advantageously, each strip line is configured so that the impedance at its second end is lower than the impedance at its first end.

According to one embodiment, the system additionally comprises an absorbent and/or resistive layers that are positioned in the cavity between the strip lines and/or in at least a portion of the tunnels.

Another subject of the invention is an RF amplifier comprising:

a first, splitter system according to the invention, capable of conveying an RF signal from a first coaxial line to a first plurality of N strip lines;

a plurality of N amplifiers for amplifying the RF signal that are coupled to the N first strip lines;

a second, combiner system according to the invention, having a second plurality of strip lines that are coupled to said amplifiers, which system is capable of conveying the amplified RF signal from the second strip lines to a second coaxial line.

BRIEF DESCRIPTION OF THE DRAWINGS

Other features, aims and advantages of the present invention will become apparent on reading the detailed description which will follow and with regard to the appended drawings given by way of non-limiting example and in which:

FIG. 17 schematically shows an RF amplifier using a splitter system and a combiner system according to the invention.

DETAILED DESCRIPTION

Figure 1:
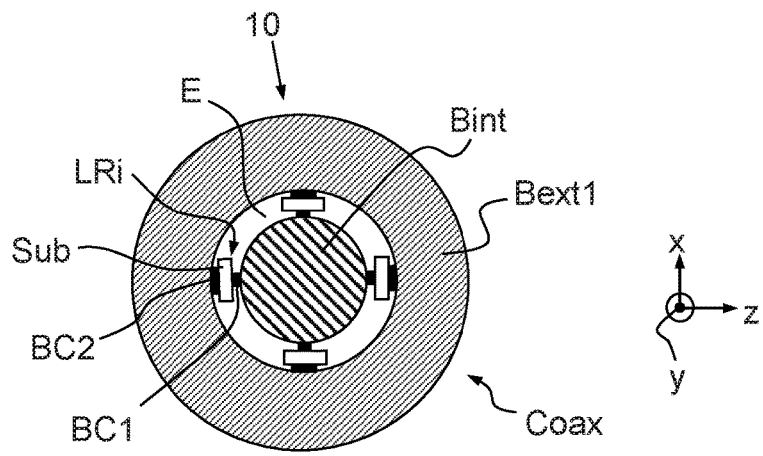
FIG. 1 illustrates a splitter/combiner system 10 according to the invention.

A splitter/combiner system 10 according to the invention is illustrated in FIG. 1. This system typically operates for an RF signal belonging to bands L to $K_4$, i.e. having a frequency between 1 GHz and 30 GHz, and over a passband typically of an octave.

The splitter/combiner 10 comprises a coaxial line Coax comprising an inner block Bint, also referred to as the "core" of the line, extending longitudinally along an axis Y. The inner block, typically taking the form of an elongated cylinder or cone, has a conductive surface, typically a layer of silver, and is inserted into an outer block Bext1, also referred to as the "body" of the line, whose inner cavities have conductive walls. The form of the outer block is elongated, for example of circular cylindrical or polyhedral cross section.

In one variant, the outer block is formed in the bulk of a conductive material, for example copper. The inner block Bint is separated from the outer block Bext1 by an insulating space E, typically air.

The coaxial line has an end referred to as the connection end.

Figure 2:
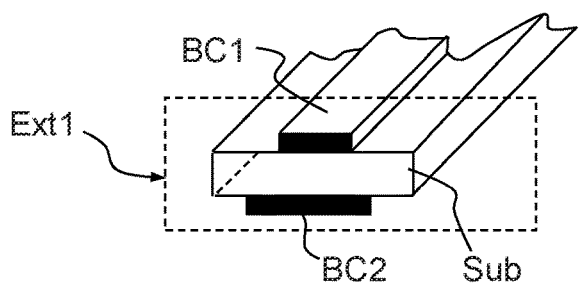
FIG. 2 illustrates a strip line according to the invention.

The splitter/combiner additionally comprises a plurality LR of N strip lines LR1, LR2, . . . LRN, each strip line, also illustrated in FIG. 2, comprising a first conductive strip BC1 and a second conductive strip BC2 that are positioned facing either side of an insulating or dielectric substrate Sub. Each strip line comprises a first end Ext1 that is capable of being connected to the connection end of the coaxial line.

The connection is made according to the following geometry: the first ends Ext1 are inserted, tangentially on the perimeter of the inner block Bint, into the space E, at the connection end of the coaxial line Coax, as illustrated in FIG. 1. The first conductive strip BC1 at the first end Ext1 makes electrical contact with the inner block Bint and the second conductive strip BC2 of the strip line at the first end Ext1 makes electrical contact with the outer block Bext1. Additionally, the outer block Bext1, and hence the conductive strips BC2, is connected to the system ground.

The spatial splitting/recombining of power is carried out in the interface between the coaxial line Coax and the strip lines. In splitter configuration, an RF signal being propagated through the coaxial line is coupled to N strip lines, and is subsequently propagated along these lines. In combiner configuration, a plurality of RF signals being propagated through the strip lines are recombined in order to be propagated along the coaxial line. N is typically between 4 and 15.

The coaxial line does not need to be oversized with respect to the wavelength of the useful RF signal, and using a coaxial guide of smaller diameter (with respect to the prior art) allows broader frequency bands, with higher useful frequencies, or an equivalent frequency band with a smaller number of paths (see also FIG. 5 below), to be obtained.

A coaxial line of small diameter combined with the connection made in the space E additionally allows the system 10 according to the invention to be less bulky and in a compact format.

Typically, for an X-band signal, the diameter of the coaxial line, defined by the diameter of the inner block plus space, is about 8 mm. The diameter not to be exceeded will be evaluated with respect to the relationships that allow the resonance frequencies and the higher modes to be determined: For example, in a cylindrical cavity, exceeding a diameter of $c/f \times 0.59$ [m] is avoided, and in a coaxial guide, the sum of both diameters (that of the core+that of the body) must not exceed $c/f \times 0.64$ [m], where c is the speed [m/s] of light in the insulating medium (air, vacuum, dielectric, etc.) and f is the maximum useful frequency [Hz].

A strip line used in the invention is referred to as a broadside-coupled line, as these are well suited to the coaxial interface. Propagation over broadside-coupled lines resembles that of bifilar lines. On the other hand, when one of the strip is placed on a broader conductor, e.g. on the metal wall of an element of larger size such as B (FIG. 7), then the propagation resembles that of a microstrip line.

Typically, the substrate is a dielectric substrate of organic type (PTFE and glass) and the conductive strips are made of copper with a silver coating.

Certain dimensions of these lines may be optimized in the context of the invention, as described below.

The fact that each conductive strip BC2 and the outer block with which they make electrical contact are connected to the system ground presents multiple advantages. For DC and at low frequency they are at the same potential, which is preferable.

Moreover, each conductive strip BC1 is connected to the core of the coaxial structure Bint and is constantly isolated from the ground of the structure Bext.

Additionally, the ground is located on the outside of the structure of the system and on each conductive strip BC2 of the strip lines LRi. At high frequency, there is no single radiofrequency ground plane but rather a plurality of radiofrequency grounds, one for each strip line. These grounds are directly accessible via the individual strips BC2, thereby allowing associated equipment (such as amplifiers) to be connected to a second end of each strip line LRi, the ground of which equipment may be directly connected to the associated conductive strip. Connection is easy and without risk of short circuit.

Figure 3:
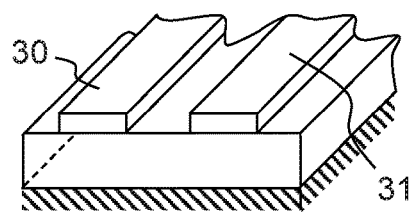
FIG. 3 illustrates conventional parallel lines where the conductive strips are positioned on the same side of the substrate.
Figure 4:
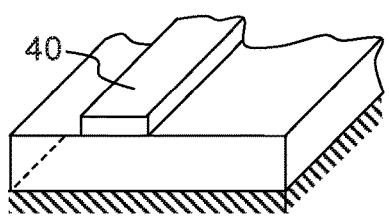
FIG. 4 illustrates a line where a single conductive strip is facing a ground of large size.

These strip lines according to the invention must not be conflated with, on the one hand, the conventional parallel lines illustrated in FIG. 3 where the conductive strips 30 and 31 are positioned on the same side of the substrate with or without a ground plane on the opposite side, and, on the other hand, with a microstrip such as illustrated in FIG. 4 where a single conductive strip 40 is facing a ground of large size. When this type of microstrip is used, at high frequency the ground is not individually defined but rather there is a ground plane shared by all of the microstrips, and connecting individual items of equipment associated with each microstrip is problematic.

These are also not antipodal lines such as in the prior art described above. Each strip line according to the invention is a strip from the outset; there is no geometric transformation of the strip and at most there is a variation in width, as described below.

The geometry of the strip lines that are used for the invention allows electrical continuity with the coaxial line to be provided via a connection in the space E. The configurations of the electromagnetic fields propagated over the stip lines and over the coaxial line are close to one another and consequently it is possible to efficiently optimize insertion losses.

Figure 5:
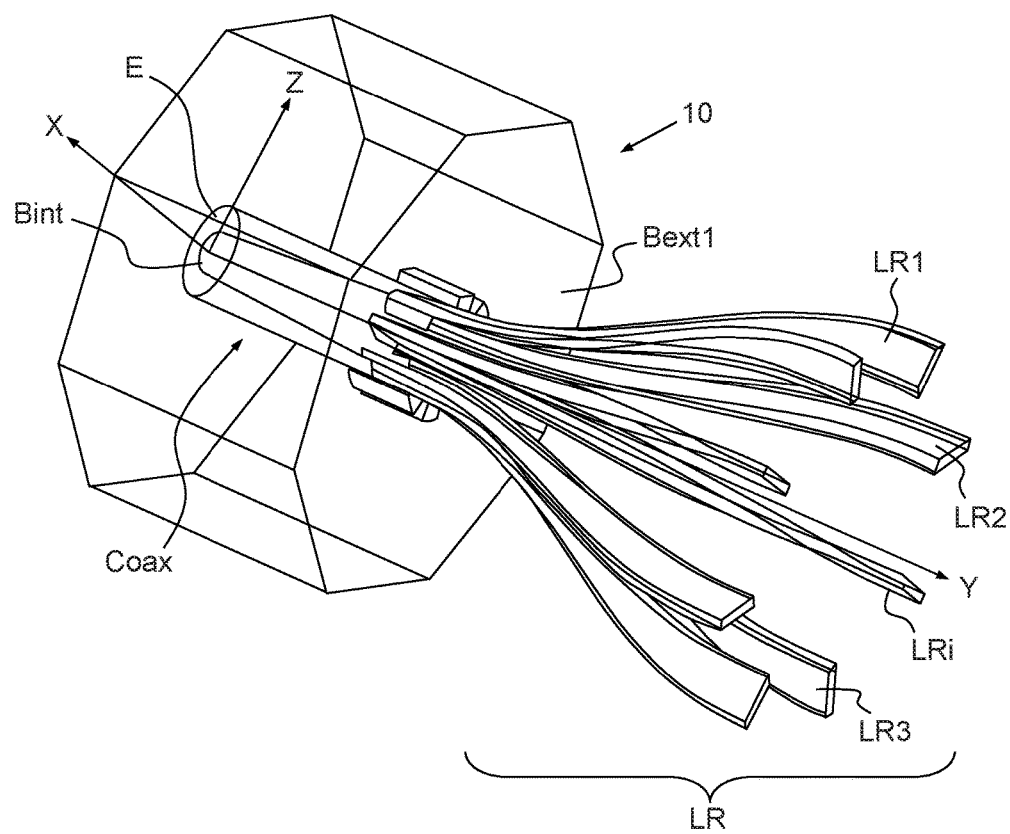
FIG. 5 schematically shows a perspective view of the system according to the invention.

A perspective view of the system 10 is schematically shown in FIG. 5. In this view it is noted that the internal diameter of the coaxial portion does not widen along the coaxial portion, thereby preserving the single-mode operation and hence optimal performance and the broadest possible useful frequency band, as explained above. Thus, the internal diameter of the coaxial portion is such that only the fundamental mode is propagated through the coaxial portion of the system.

Preferably, the coaxial line Coax is configured so as to be single mode, in a frequency band used by the system 10, in order to avoid higher propagation modes and parasitic modes. Typically, only the fundamental mode is propagated. The performance of the combiner/splitter increases the further away the cutoff frequencies of the higher modes are from the useful frequency band. This implies maximum dimensions that are not to be exceeded. Inter alia, the reduced size of the non-oversized coaxial line allows the useful frequency band to be located below parasitic resonances and other non-fundamental propagation modes. For example, for a useful frequency of 14 GHz, a maximum diameter (core plus space E) is 8 mm.

In order to optimize the transition between the coaxial line Coax and the N strip lines LR1 . . . LRN, i.e. to reduce insertion losses, the impedance should be matched between the coaxial line at its connection end and each strip line at its first end, i.e. the impedance of each first end Ext1 of the strip lines is matched to the impedance of the coaxial line Coax at the connection end.

Advantageously, in order to contribute to the impedance matching, the impedance Zext1 at the first end Ext1 of each strip line is substantially equal to N times the impedance of the coaxial line Zc/rac at its connection end:

$$Zext1 = N \cdot Zc/rac \qquad (1)$$

In order to make them equal (1), a first variant is to reduce the impedance of the coaxial line at its connection end. In this case, the coaxial line carries out an impedance transformation which gradually reduces the impedance from that of its outer end, typically 50 ohms, to a lower impedance at the connection end Zc/rac, typically 20 or 30 ohms. This may be carried out by an inner block Bint taking the form of a cone.

The conical form of the inner block, i.e. of the core of the coaxial line, allows, according to one variant, the lines to be fixed in place simply by applying pressure (force-fitting) thereto in the coaxial gap E.

As the number of strip paths increases, the lower the impedance Zc/rac of the coaxial line at the connection end must be so that impedance matching may be easily achieved.

As the coaxial portion is connected to N strip lines, the characteristic impedance Zext1 at the base of each of these strip lines must be approximately Zc/rac×N.

A second variant, which is advantageously combined with the first variant, is therefore to increase the impedance of each strip line at its first end. For example, for an impedance Zc/rac of 30 ohms and 10 strip line paths, the impedance at the first end of each strip line must be substantially equal to 300 ohms.

The EM fields of the strip lines and of the sectors of coaxial line are similar and consequently, for dimensions of the same order of magnitude, this transition from one line to the other does not represent a major discontinuity.

Figure 6:
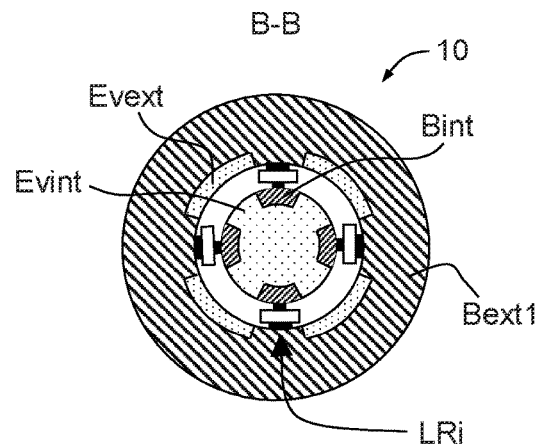
FIG. 6 illustrates a variant of a splitter/combiner system according to the invention comprising voids.
Figure 7:
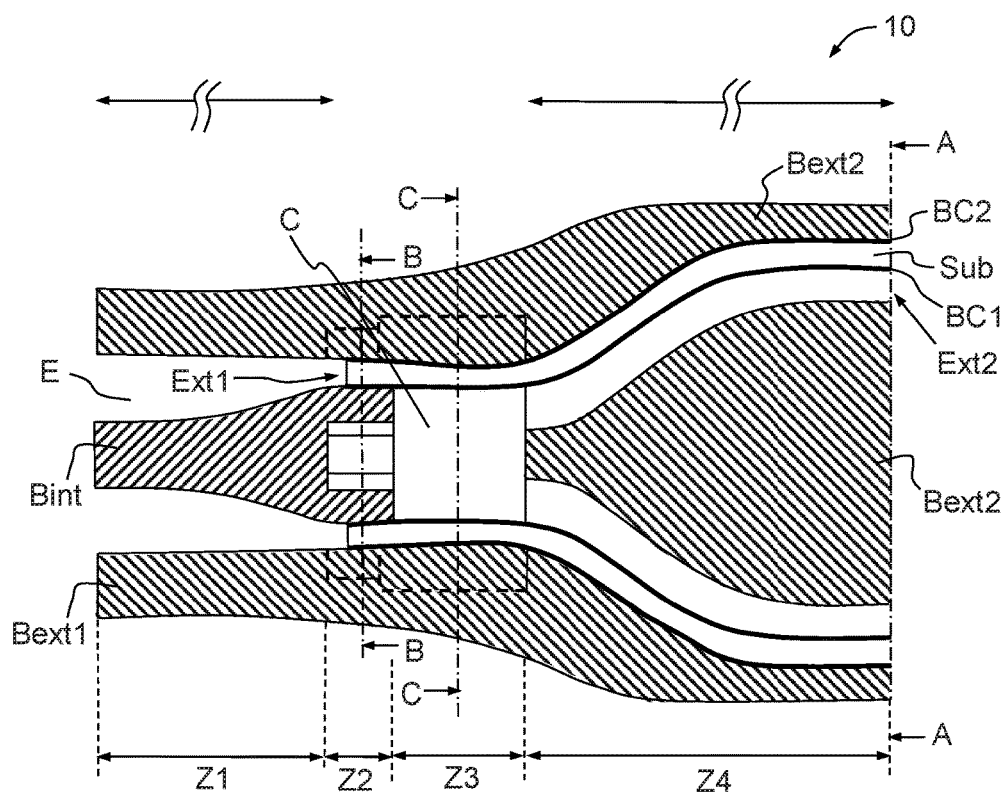
FIG. 7 schematically shows a cross section of the variant of a splitter/combiner system of FIG. 6.

According to a first variant, the inner block Bint and the outer block Bext have, at the connection end, voids Evint, Evext that are located between adjacent lines, so as to contribute to said impedance matching, as illustrated in FIG. 6 (section B-B of FIG. 7). The void area of the coaxial line at its connection end is also illustrated in the cross-sectional diagram of the system 10 in FIG. 7, corresponding to a variant described below, and corresponds to the area Z2, the area Z1 corresponding to the area in which the coaxial line is conventional. The central portion of the inner block facing the void area Z2 is advantageously also voided. These voids are made, for example, by machining the coaxial line in the area Z2 of transition with the strip lines. The introduction of the strip lines into the coaxial line locally decreases the impedance of the latter. This results in a local increase in the coupling between Bint and Bext1 due to the presence of the strip lines. The voids make it possible to compensate for this and to reduce the coupling between Bint and Bext1.

According to a second variant, the characteristic impedance of the strip lines is further locally increased at the end Ext1 by introducing longitudinal drill holes in the substrates Sub at their end. These drill holes provide greater flexibility for improved tolerance of the assembly pressure and of variations in dimensions linked to variations in temperature.

Figure 8:
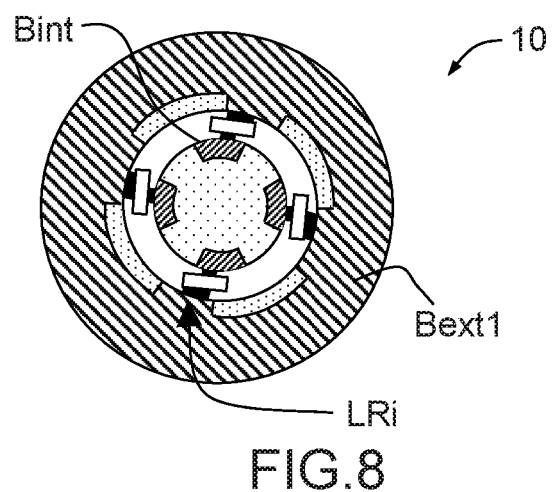
FIG. 8 illustrates another variant combined with the variant of FIG. 6 in which strip lines are laterally offset with respect to one another.

According to a third variant illustrated in FIG. 8, advantageously combined with the preceding variants, the facing conductive strips BC1 and BC2 of the strip lines are advantageously laterally offset with respect to one another at the first end, in order to increase their characteristic impedance. The offset distances the two strips and consequently increases the characteristic impedance of the line.

Care is taken to produce the offset in such a way that the twisting of the lines (see below) reinforces the contact of the connection between the lines and the coaxial portion Coax. The offset is mainly needed at the end Ext1, the strips subsequently progressively being superposed along the length of the lines.

Figure 9:
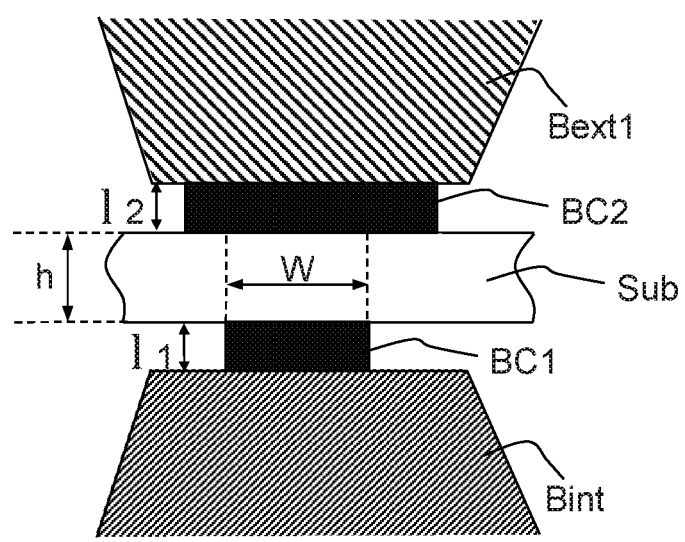
FIG. 9 illustrates a strip line according to the invention.

According to another variant illustrated in FIG. 9, for each strip line, the width w over which the two conductive strips BC1 and BC2 are facing one another, along with their respective thicknesses I1 and I2, are determined so as to contribute to the impedance matching in the transition area, i.e. at the first end. Typically, in order to locally increase the impedance of the strip line at its first end, the thicknesses I1 and I2 must be thicker than for a standard strip line, and the width w smaller.

Specifically, the impedance of the strip line is locally proportional to h/w, and when it makes electrical contact with the inner and outer blocks, the impedance tends to decrease further the lower I1 and I2 are.

For example, for an X-band RF signal, the width w is smaller than or equal to 1 mm and the thicknesses I1, I2 are greater than or equal to 80 μm.

According to one embodiment illustrated in FIG. 7, the system 10 according to the invention is produced in a block B that comprises the portion Bext1 and the extension thereof, Bext2. All of the walls of the inner cavities are conductive.

Figure 10:
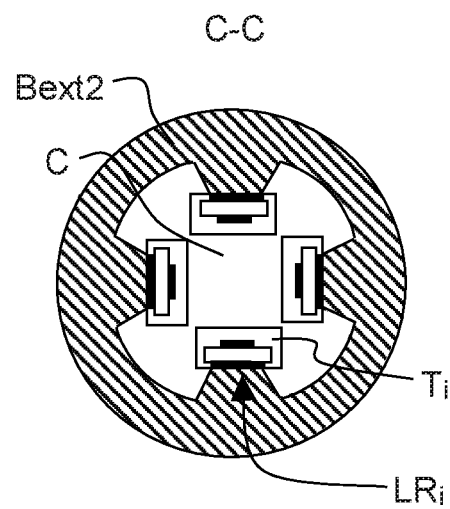
FIG. 10 schematically shows a system according to invention comprising a cavity adjoining the connection end of the coaxial line.

The system also comprises a cavity C adjoining the connection end of the coaxial line, corresponding to the section Z3 of FIG. 7. The strip lines LR1, LR2 . . . are fixed to the block, as illustrated in FIG. 10 corresponding to the section C-C of FIG. 7.

The sections Z1, Z2 and Z3 are all of small diameter, the interior diameter is substantially constant, there is no widening, thereby providing for the single-mode operation and small dimensions of the system. Moreover, in this diagram it is noted that there is no electrical contact between the inner block Bint, connected to a chosen potential, and the outer block Bext (Bext1 and Bext2), connected to the ground of the splitter/recombiner system.

Figure 11:
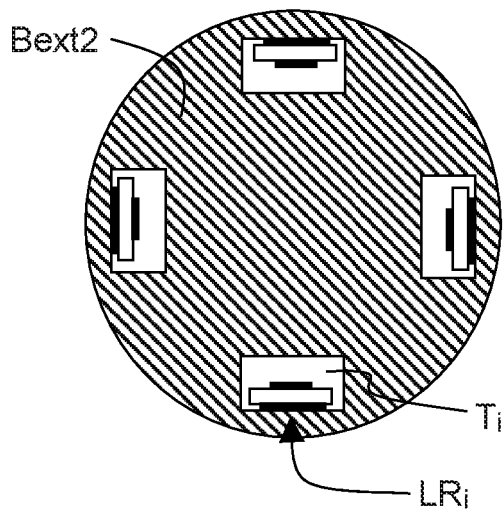
FIG. 11 illustrates the plurality of tunnels of a system according to the invention.

The system additionally comprises a plurality of N tunnels T1, T2 . . . TN hollowed out of the portion Bext2 of the block B, corresponding to the section Z4 of FIG. 7 and illustrated in FIG. 11 (section A-A of FIG. 7). Each tunnel Ti comprising an associated strip line. Advantageously, the tunnels are configured so that a second end Ext2 of each strip line is positioned in a circle having a diameter that is greater than the diameter of the coaxial line (FIG. 12); the strip lines are thus distanced from one another so that each path is amplified separately. The conductive strip that is initially connected to Bext1 of the coaxial portion is secured to (bonding, soldering) and makes electrical contact with a wall of the tunnel and the other conductive strip that is initially connected to Bint stays without making contact with Bext2 (located more centrally in the sections of FIG. 12). According to one embodiment, in order to facilitate manufacture, the portions Bext1 and Bext2 are made in one go and form a single block.

Figure 12:
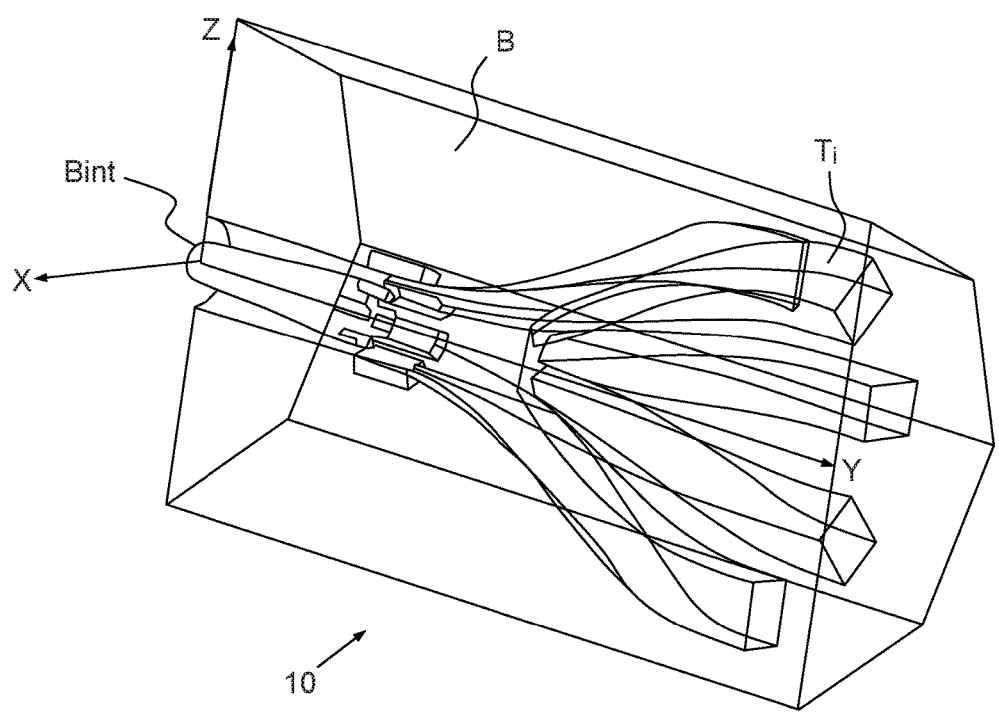
FIG. 12 schematically shows a perspective view of a variant of the system 10 produced in a single block.

A perspective view of the system 10 produced in a single block B is schematically shown in FIG. 12. This view shows the hollows present in the block B.

The pseudo-cylindrical cavity C, typically filled with air, carries out the transition between the first ends of the strip lines that are concentrated around the connection end of the coaxial line of small diameter and the various tunnels Ti accommodating the strip lines while avoiding short circuits and allowing these strip lines to be distanced from one another in order to produce an amplifier as described below. The size of the cavity is small enough not to generate higher modes or parasitic resonances in the useful frequency band. This sizing is carried out with care, as the cavity C is the source of a peak resonance which may typically form a high cutoff frequency for the entirety of the structure.

Figure 13:
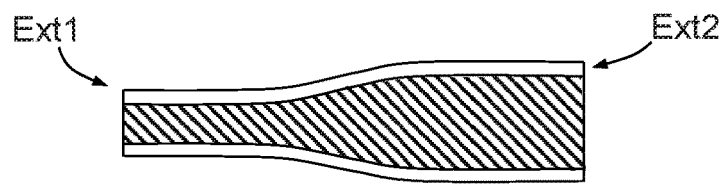
FIG. 13 illustrates a flexible strip line substrate.

Advantageously, the substrate Sub of the strip lines is flexible so as to facilitate adaptation to the corresponding tunnel and to adapt more easily to the stresses linked to variations in temperature and to the differential expansions of the various assembled elements, as illustrated in FIG. 13.

Figure 14A:
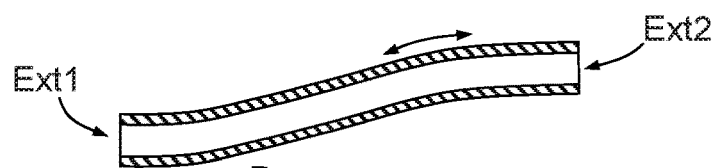
FIGS. 14a-14c illustrate a flexible strip line substrate being twisted.
Figure 14B:
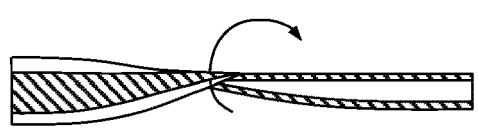
Figure 14C:
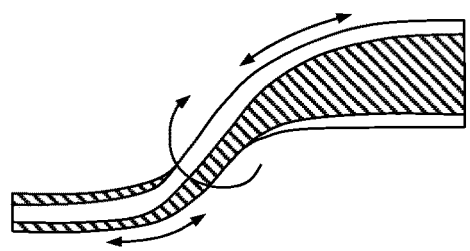

Also advantageously, the flexible substrate is such that it allows combined flexing and twisting during assembly, without being damaged or weakened, as illustrated in FIGS. 14a-14c. Thus, each strip line typically exhibits two flexions of about 30° in the associated tunnel.

In a variant, a substrate formed from multiple dielectric layers allows the combined twisting and flexing possibilities thereof to be optimized, while obtaining appropriate electrical characteristics (low permittivity, low dielectric losses, ability to withstand high electric fields, the highest possible thermal conductivity).

Figure 15:
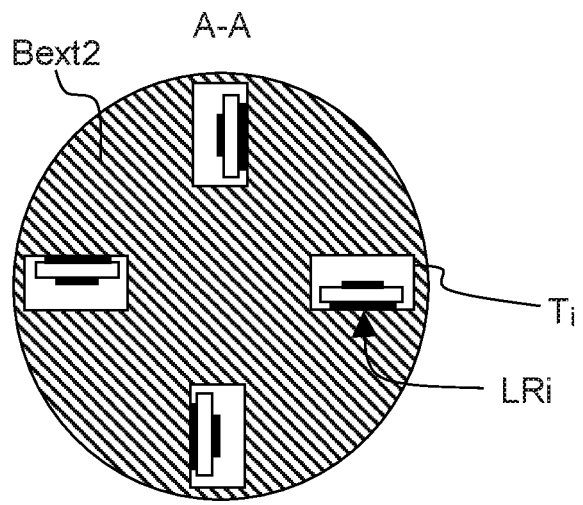
FIG. 15 schematically shows a cross section of the strip lines being twisted by 90° at the output of the tunnels according to the invention.

FIG. 15 schematically shows a cross section A-A of the strip lines being twisted by 90° at the output of the tunnel. Twisting the lines allows the associated amplifiers (see below) to be arranged in a compact manner.

The block B may be made of plastic, with walls coated in silver, or entirely made of copper.

Advantageously, the mechanical portion of the block B that comprises the strip lines, whose form is complex but not very sensitive in terms of manufacturing precision, is produced by 3D printing based on various materials, conductors, ceramics or composites. According to one embodiment, the block B is composed of multiple portions, and according to another embodiment, the block B is composed of a single block (one piece) produced Advantageously, the system 10 comprises a cooling system, typically a system comprising a heat pipe coiled around the area of maximum heating that is located on the strip lines, just after their transition with the coaxial portion, i.e. in the cavity C.

Figure 16:
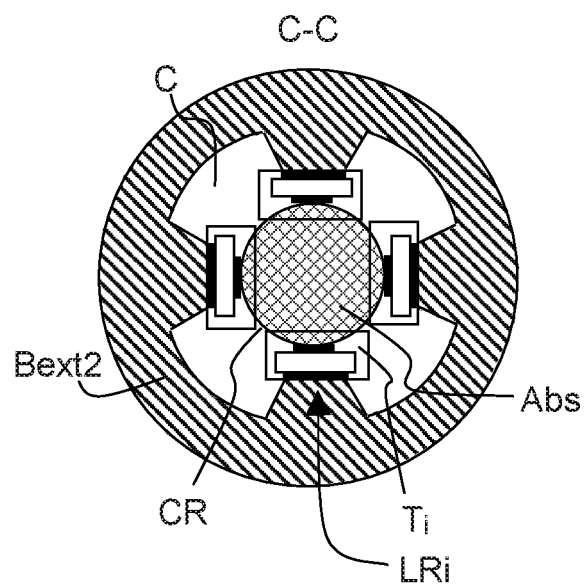
FIG. 16 illustrates a system according to the invention comprising an absorbent and/or resistive layers that are positioned in the cavity between the strip lines and/or in at least a portion of the tunnels.

Advantageously, the system 10 additionally comprises an absorbent Abs and/or resistive layers CR that are positioned in the cavity C between the strip lines and/or in at least a portion of the tunnels, as illustrated in FIG. 16. The resistive elements CR roughly form a ring with which the strip connected to the core of the coaxial line are in tangential contact. In the same way, the absorbent Abs roughly forms a cylinder with which the strip connected to the core of the coaxial line are in tangential contact.

These resistors and/or this absorbent together insulate the paths, which may prove useful in stabilizing and countering the electrical and physical dissymmetries of the amplifier module (see below).

Another subject of the invention is an RF amplifier 100 using a splitter system and a combiner system according to the invention, schematically shown in FIG. 17.

The RF amplifier 100 comprises a first, splitter system 101 according to the invention, capable of conveying an RF signal from a first coaxial line CoaxI to a first plurality of N strip lines LRI. The system 100 also comprises a plurality A of N elementary amplifiers A1, A2, ... AN for amplifying the RF signal that are coupled to the N first strip lines, and a second, combiner system 102 according to the invention having a second plurality of strip lines LRII that are coupled to the elementary amplifiers, which system is capable of conveying the amplified RF signal from the second strip lines to a second coaxial line CoaxII.

The elementary amplifiers are typically produced using GaAs or GaN semiconductor technology, integrated with their matching networks in a standard housing, with a heat sink which also serves as a ground plane and RF accesses that are capable of being connected to strip lines by soldering.

Advantageously, each strip line is configured so that the impedance at its second end is lower than the impedance at its first end Ext1. Specifically, the characteristic impedances of the amplifiers are typically 50 ohms. The impedance should therefore be transformed between the first end Ext1 (see formula (1) N×Zc/rac), typically of the order of 300 ohms, and the second end that is coupled to the amplifier, which must therefore be close to 50 ohms. Thus, the length of line required for carrying out this impedance transformation is used for making the connection to the elementary amplifiers, whose access ports are centred on a circle of larger diameter (offset with regard to the radius) and whose accesses also exhibit a rotation of the EM fields on the longitudinal axis, typically of 90°.

According to the embodiments of the coaxial and strip lines, and also according to the target RF powers, the impedance transformation ratios will be optimized/distributed between these two types of lines.

An example of sizing for a useful frequency band corresponding to the 8-12 GHz X-band is given below.

The coaxial access has a standard characteristic impedance of 50 ohms. The coaxial line Coax carries out an impedance reduction, e.g. to 20 ohms, over a length that is adequate for covering the useful frequency band, in particular for providing the low cutoff frequency: 20 mm provide a low cutoff frequency located towards 8 GHz. The impedance transformation is implemented according to the conventional method published by Klopfenstein in 1956. This method allows the optimal impedance variation curve to be determined in order to devise an impedance transformation. The diameters of this coaxial line are chosen so as to be smaller than the diameters at which higher modes may appear, hence below the useful high cutoff frequency: the structure solely propagates the fundamental mode in the useful frequency band. For an internal shielding diameter of 8 mm (core plus space E), the first parasitic mode occurs towards 14 GHz on the low impedance side, located beyond 12 GHz.

N=8 strip lines are arranged regularly in the gap between the core and the body of the coaxial line. At this end Ext1, their impedance is close to 20×8=160 ohms.

These strip lines subsequently carry out an impedance reduction, typically to 50 ohms on the accesses of the unitary amplifiers, over a length that is adequate for covering the useful frequency band and for achieving the required twists and curves: a length of 44 mm fulfils these conditions. The impedance transformation is implemented according to the aforementioned Klopfenstein method. The strip are composed of copper tracks, with a thickness of 0.1 mm and a minimum width (area T2 of FIG. 7) of 0.6 mm. The substrate, with a thickness of 0.9 mm, is composed of polytetrafluoroethylene (PTFE or Teflon) and glass fibre.

The length of the cylindrical cavity C in which the strip lines are separated is fixed at 20 mm, which places the first parasitic resonance substantially above the useful frequency band, towards 18.4 GHz.

The invention claimed is:

1. A splitter/combiner system for RF signals comprising:
   a coaxial line comprising an inner block extending longitudinally along an axis Y, having a conductive surface and being inserted into an outer block whose inner cavities have conductive walls, the inner block being separated from the outer block by an insulating space, said coaxial line having a connection end;
   a plurality of N strip lines, each strip line comprising a first and a second conductive strip that are positioned facing either side of an insulating or dielectric substrate;
   one of the ends of each strip line, referred to as the first end, being positioned tangentially on the of the inner block in said space at the connection end of the coaxial line, the first and the second conductive strips of the first end of the strip line making electrical contact with the inner block and the outer block, respectively, the outer block additionally being connected to a system ground.

2. The system according to claim 1, wherein an impedance of each first end of the strip lines is matched to an impedance of the coaxial line at the connection end.

3. The system according to claim 2, wherein an impedance at the first end of each strip line is substantially equal to N times the impedance of the coaxial line at its connection end, so as to contribute to matching an impedance of each first end of the strip lines to the impedance of the coaxial line at its connection end.

4. The system according to claim 2, wherein the inner block and the outer block have, at the connection end, voids that are located between adjacent strip lines, so as to contribute to impedance matching.

5. The system according to claim 2, wherein, for each strip line, a width over which the two conductive strips are facing one another, along with respective thicknesses of said two conductive strips, are determined so as to contribute to impedance matching.

6. The system according to claim 5, suitable for an X-band RF signal, wherein said width is smaller than or equal to 1 mm and said respective thicknesses are greater than or equal to 80 μm.

7. The system according to claim 2, wherein the facing conductive strips are laterally offset with respect to one another at the first end so as to contribute to impedance matching.

8. The system according to claim 1, wherein a form of the inner block of the coaxial line is conical.

9. The system according to claim 1, wherein the coaxial line is configured so as to be single mode in a frequency band used by the system.

10. The system according to claim 1, produced in a block comprising the outer block and whose inner cavities have conductive walls, said system additionally comprising:
    a cavity adjoining the connection end of the coaxial line, the strip lines being fixed to the block, and
    a plurality of N tunnels hollowed out of said block, each tunnel comprising an associated strip line of said plurality of N strip lines.

11. The system according to claim 10, wherein said cavity is dimensioned so as not to propagate parasitic modes and/or not to generate resonances in a band of frequencies used by the system.

12. The system according to claim 10, wherein said tunnels are configured so that a second end of each strip line is positioned in a circle having a diameter that is greater than a diameter of the coaxial line.

13. The system according to claim 10, wherein which each strip line is configured so that an impedance at its second end is lower than an impedance at its first end.

14. The system according to claim 10, additionally comprising an absorbent and/or resistive layers that are positioned in the cavity between the strip lines and/or in at least a portion of the tunnels.

15. An RF amplifier comprising:
- a first, splitter system according to claim 1, capable of conveying an RF signal from a first coaxial line to a first plurality of N strip lines;
- a plurality of N amplifiers for amplifying said RF signal that are coupled to the N first strip lines;
- a second, combiner system according to claim 1, having a second plurality of strip lines that are coupled to said amplifiers, which system is capable of conveying the amplified RF signal from the second strip lines to a second coaxial line.

\* \* \* \* \*